United States Patent [19]

Clark et al.

[11] Patent Number: 5,014,162
[45] Date of Patent: May 7, 1991

[54] SOLDER ASSEMBLY OF COMPONENTS

[75] Inventors: William A. Clark, Randolph; Michael A. Oien, Chatham; Walter Pelosi, Randolph, all of N.J.

[73] Assignee: AT&T Bell Laboratories, Murray Hill, N.J.

[21] Appl. No.: 372,400

[22] Filed: Jun. 27, 1989

[51] Int. Cl.⁵ .............................................. H05K 1/11
[52] U.S. Cl. .................................. 361/412; 361/398; 361/403; 361/406; 361/414
[58] Field of Search ............... 361/398, 400, 403, 405, 361/406, 410, 413, 414

[56] References Cited

U.S. PATENT DOCUMENTS

| | | | |
|---|---|---|---|
| 3,676,746 | 7/1972 | Kassabgi . | |
| 3,953,664 | 4/1976 | Tsunashima | 361/400 |
| 4,064,357 | 12/1977 | Dixon et al. | 174/68.5 |
| 4,437,141 | 3/1984 | Prokop | 361/403 |
| 4,806,107 | 2/1989 | Arnold et al. | 439/79 |

FOREIGN PATENT DOCUMENTS 2657313 6/1978 Fed. Rep. of Germany ...... 361/400

Primary Examiner—Gregory D. Thompson
Attorney, Agent, or Firm—Lester H. Birnbaum

[57] ABSTRACT

Disclosed is an apparatus involving soldering of components, such as the soldering of flexible circuits to printed circuit boards. Holes are provided in the areas of one component which are to be soldered to pads on the other component. Precise amounts of solder are provided to each pad, preferably by a shuttle element which carries solder paste in cavities corresponding to the pads and which deposits the solder on the pads when the solder is melted. The holes in the component are aligned with the pads, and the solder is reflowed so that a visible solder fillet is formed above the holes to permit inspection of the solder joint.

5 Claims, 5 Drawing Sheets

SOLDER ASSEMBLY OF COMPONENTS

BACKGROUND OF THE INVENTION

This invention relates to solder assembly of components.

Soldering of components is often a critical operation in the fabrication of circuits and devices since failure to form an effective solder joint can result in costly yield and reliability problems. These problems are especially prevalent when an area array of solder joints is needed. For example, in certain high performance connectors, a flexible printed circuit may be used to electrically connect a contact element to a rigid printed circuit board. For high density applications, the flexible circuit might preferably terminate in an area array which must be electrically coupled to corresponding terminations on the printed circuit board. One technique for attachment involves the use of conductive pins inserted in holes formed in the corresponding terminations in the flexible circuit and circuit board. (See, for example, U.S. Pat. No. 4,806,107, issued to Arnold et al, which is incorporated by reference herein.) It would be more desirable to solder the flexible circuit directly to the circuit board since that would provide for improved electrical performance of the circuits and eliminate the need for extra piece parts.

Solder assembly of a flexible circuit to a rigid printed circuit board is typically done by solder plating the ends of the conductive lines on the flexible circuit and on the circuit board, and then using a hot ram to reflow the plating and form a linear arrangement of solder joints between corresponding lines. A major problem is that solder joint formation is often not reliable, and many mis-formed joints would not be detectable until the final testing of the device since such joints would be hidden under the component.

It is, therefore, an object of the invention to provide a method of soldering which results in high yields and readily inspectable and repairable solder joints.

Another concern in soldering of components is to provide just the right amount of solder to the pad arrays for forming an effective solder joint. Inadequate amount of solder can lead to problems in forming reliable solder joints with high yield, and excessive solder can result in formation of solder bridges between adjacent conducting elements and hence the need for repair. Plating often does not deposit an adequate solder volume dependably. Solder dipping is a possible approach to providing an enhanced solder coating on components, but the lack of control of solder volume leads to lack of control over the assembly process which produces assembly yield problems. Another approach, which is often used for surface mounted components, is to deposit the solder in the form of a paste through apertures in a stencil. Control of the deposited solder in such cases can become a problem depending on the ratio of the aperture width and thickness of the stencil. This is because solder paste can cling to the stencil rather than deposit on the circuit board, and tacky deposits can build up on the walls of the apertures and interfere with solder deposition.

It is, therefore, a further object of the invention to provide a method and apparatus for depositing a well-controlled amount of solder in a desired location.

SUMMARY OF THE INVENTION

These and other objects are achieved in accordance with the invention which, in one aspect, is a method for attaching a first component to a second component. Metalized holes are provided in the pad areas of the first component to be attached to corresponding pad areas of the second component. A controlled amount of solder is deposited on the corresponding pad areas of the second component. The first component is brought into contact with the solder on the second component so that the holes are aligned with the corresponding pad areas. The components are heated to melt the solder and to cause the solder to form fillets extending through the holes so that the fillets may be observed.

In accordance with a further aspect, the invention is a method for depositing a well-controlled amount of solder to specified pad areas of a component. A controlled amount of solder is deposited in cavities in a major surface of a shuttle member which is made of a material not wettable by solder. The cavities correspond to the specified pad areas of the component. The shuttle member is brought into contact with the component so that the cavities are aligned with their corresponding pad areas of the component. The shuttle is heated in order to melt the solder and cause the solder to flow onto the pad areas of the component.

In accordance with a still further aspect, the invention is a device comprising first and second components with pad areas on facing surfaces which are soldered together. At least one of the components includes metalized holes in the pad areas which are soldered. Solder fillets are formed between pad areas on the facing surfaces and extend through the holes to associated pad areas on the surface of said one component opposite to the facing surface so that the fillet can be inspected.

BRIEF DESCRIPTION OF THE DRAWING

These and other features of the invention are delineated in detail in the following description. In the drawing.

It will be appreciated that, for purposes of illustration, these figures are not necessarily drawn to scale.

DETAILED DESCRIPTION

Figure 1:
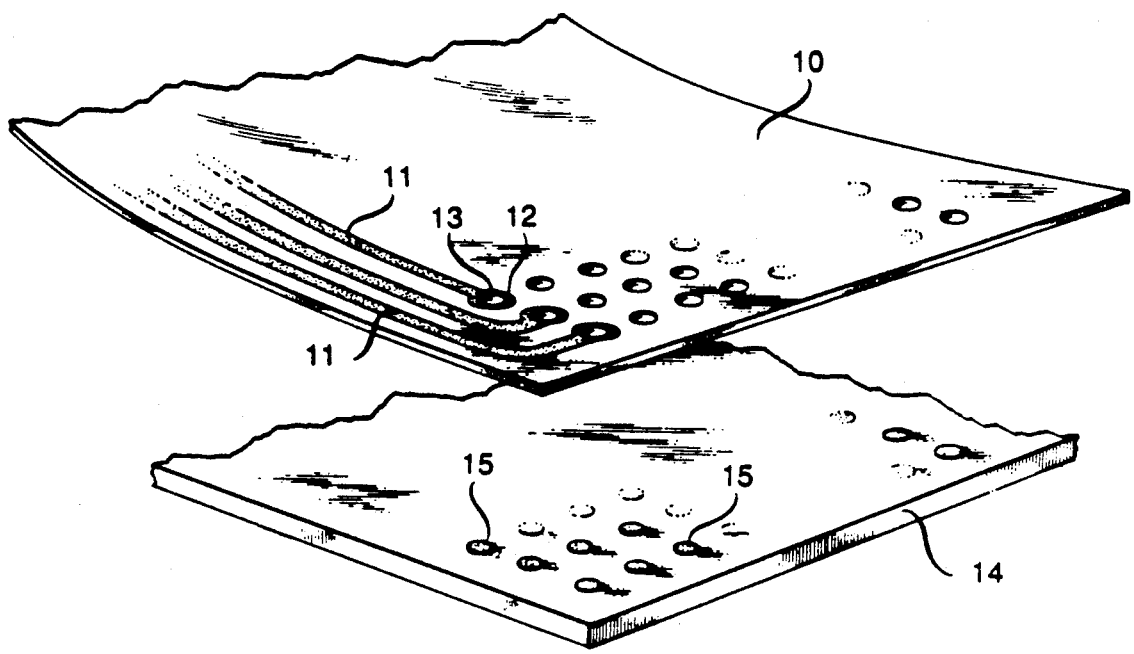
FIG. 1 is a perspective view of portions of components which can be assembled in accordance with an embodiment of the invention.
Figure 9:
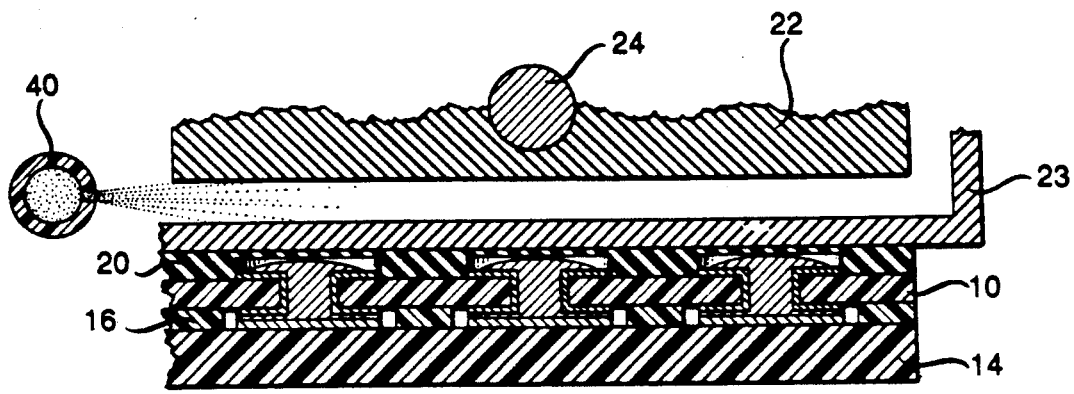
Figure 10:
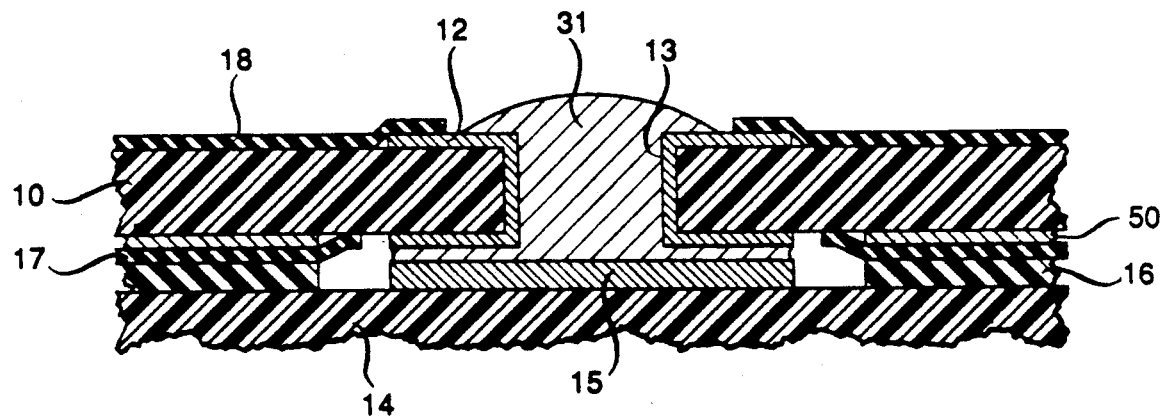
FIG. 10 is a cross-sectional view of a portion of the assembled components in accordance with the same embodiment.

FIG. 1 illustrates two components which can be bonded in accordance with the invention. Component, 10, is a flexible printed circuit which is typically made of a dielectric material such as polyimide and includes a plurality of conductive paths, 11, typically comprising copper. Only three such paths are shown for illustrative purposes. Each path terminates in an exterior conductive pad area, such as 12, which includes a metalized hole, 13, formed therethrough to connect to a corresponding interior pad area (as shown in FIG. 10). The pads and holes form an area array in the flexible circuit as indicated in FIG. 1. Each such metallized hole and associated pad is to be bonded to a corresponding conductive pad area, such as 15, formed on the second component, 14, which is a standard printed circuit board. The board is typically made of an epoxy-glass material and the conductive pads are typically copper. The printed circuit board also usually includes a solder mask material, which is shown as 16 in FIGS. 2–10, but is not shown in FIG. 1 for the sake of clarity. This solder mask material covers essentially the entire printed circuit board except for the pads which will be soldered. Similarly, the flexible circuit, 10, includes a cover layer which is shown as layers 17 and 18 in FIG. 10, on both surfaces of the circuit, but which is also not shown in FIG. 1 for clarity. The solder mask and cover layer act to provide control of the solder wettable areas of the two components.

The flexible circuit is typically approximately 0.2 mm thick, the paths are typically 0.2 mm wide and 0.05 mm thick; the conductive pad areas are usually 0.8 mm in diameter, and the holes, 13, are typically 0.5 mm in diameter. The printed circuit board, 14, is usually 1.5 mm thick, with the pads, 15, measuring approximately 0.8 mm in diameter and approximately 0.05 mm thick.

Of course, it will be appreciated that other types of components can be assembled according to the techniques described herein.

In order to bond the flexible circuit to the printed circuit board, precise and predetermined amounts of solder should first be deposited on each printed circuit board pad, 15. One method for accomplishing this is to individually deposit solder spheres on each pad and heat the assembly in order to melt the solder and cause the spheres to adhere to each pad. Such a process can be tedious and error prone, however. Instead, in accordance with a feature of the invention, an element referred to as a shuttle element and illustrated as 20 in FIG. 2 was devised. The shuttle element is made of a material such as molybdenum steel, titanium, or aluminum which is not wettable by solder, but which is reasonably conductive of heat and which is compatible with high temperatures and cleaning operations. The shuttle element also includes an array of cavities such as 21 in at least one major surface of the element. The array of cavities matches the array of pads on the printed circuit board. The element can simply be a thin sheet of material with holes drilled therethrough and covered on one surface by a backing tape. Such a construction is preferred since the tape can be removed and the holes cleaned more easily. In this example, the cavities were 1 mm in diameter, 0.2 mm deep, and filled with approximately 0.1 mm$^3$ of solder paste. The solder paste can be deposited in the cavities by depositing the paste on the surface and then using a squeegee to smear the paste into the cavities.

Figure 2:
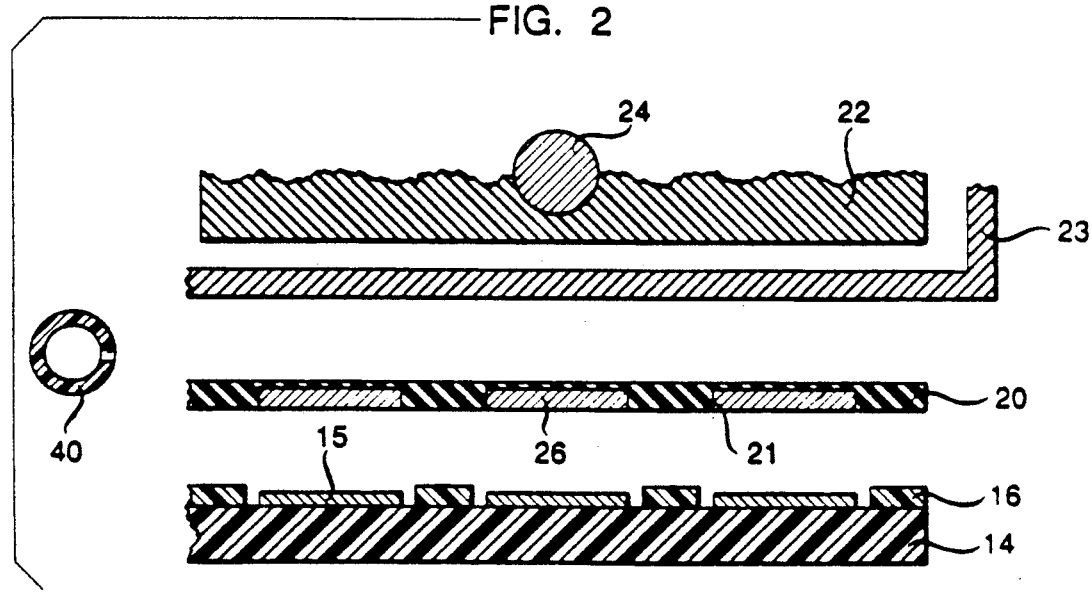
FIG. 2 is a cross-sectional schematic view of apparatus for assembling components in accordance with an embodiment of the invention.

After the cavities are filled with solder paste and dried, the shuttle, 20, is aligned with the printed circuit board, 14, as illustrated in FIG. 2 so that each cavity is above its corresponding pad. Alignment can be effectuated with standard tooling pins (not shown). The solder will remain in the cavities due to its tacky consistency at room temperature. The aligned shuttle and printed circuit board are positioned under a soldering head which comprises a hot ram, 22, and a spring-loaded hold-down element, 23. The hot ram includes a heater element, 24, to produce the desired temperature at the soldering surface. The hot ram is typically formed from a block of copper plated with nickel and the heater element is a conventional electrically resistive element. The hold-down element, which is typically molybdenum steel acts as an interface between the hot ram and the soldering surface, as well as providing some pressure to hold the stencil, and, later, the flexible circuit, to the printed circuit board. The apparatus further includes a cooling system to cool the surface of the assembly after reflowing of the solder to below the melting point of the solder. Cool air is supplied through nozzle, 40, so that air is directed to the surface of hold-down 23. The hot ram solder apparatus can be any commercially available machine such as that sold by Hughes under the designation HRS386.

Figure 3:
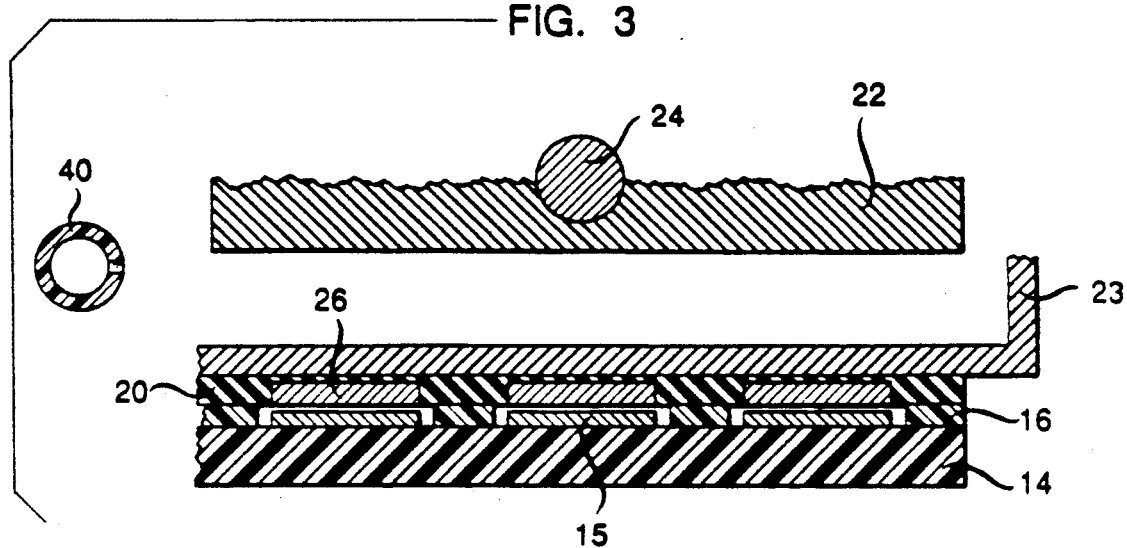
FIGS. 3-5 are schematic illustrations of various stages of processing in accordance with the same embodiment.
Figure 4:
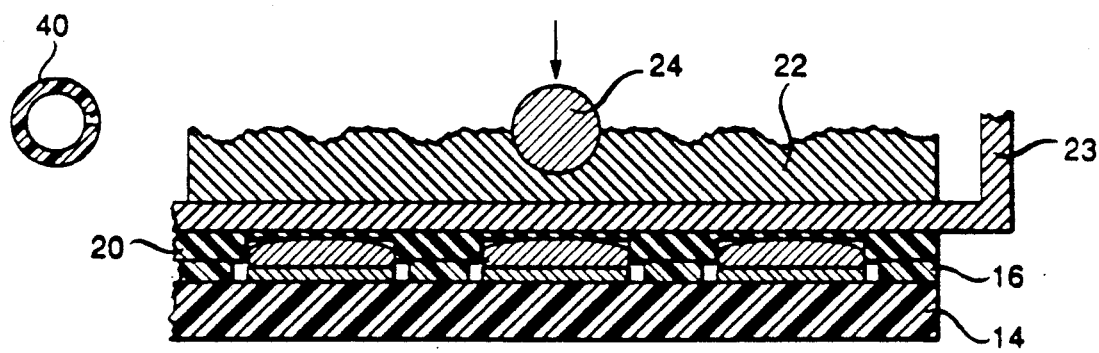
Figure 5:
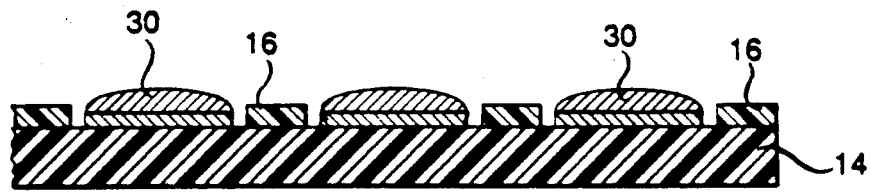

In the operation of the apparatus of FIG. 2, the soldering head is lowered until the hold-down, 23, makes contact with the shuttle, 20, as shown in FIG. 3. The hold-down is warmed by the hot ram to a temperature of about 100 degrees C. A sufficient amount of heat, therefore, is transferred to the shuttle to warm the solder paste and activate the flux in the paste. The soldering head is further lowered until the hot ram, which is maintained at 360 degrees C., makes physical contact with the hold-down as shown in FIG. 4. This causes sufficient heat to be transferred to the hold-down/shuttle/circuit board assembly to cause the solder in the shuttle cavities to reflow and wet the pads on the circuit board. The hot ram is then moved upward out of contact with the hold-down, but the hold-down still applies pressure to the shuttle in the manner previously shown in FIG. 3. At this point, air from nozzle, 40, is blown over the hold-down to cool the assembly and solidify the solder joints to the circuit board pads. The soldering head and shuttle are then fully removed from the printed circuit board. This operation leaves uniform solder deposits such as 30 on all the circuit board pads as shown in FIG. 5. The deposition and reflow operation usually takes approximately 30 seconds.

At this point, the solder fillets on the pads of the printed circuit board can be inspected to ensure good solder wetting and proper solder volume. It is generally desirable at this point that the solder wet the entire pad and project sufficiently above the plane of the solder mask to ensure a proper fillet in subsequent operations.

Figure 6:
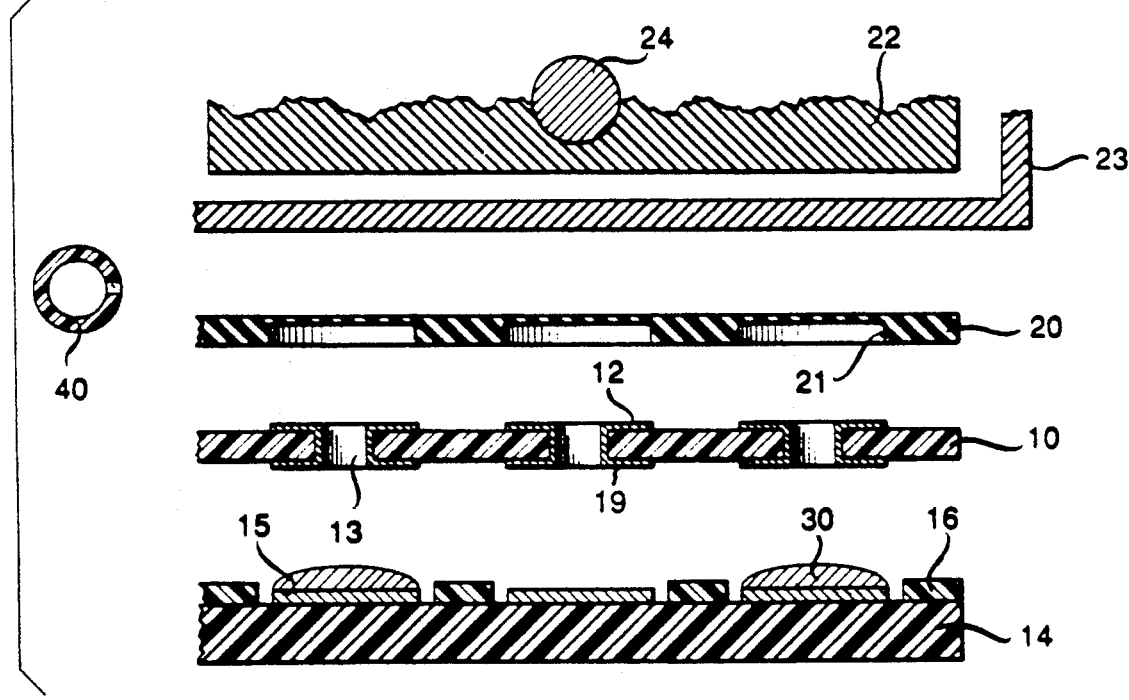
FIG. 6 is a schematic illustration of the apparatus of FIG. 2 during a later stage in processing.
Figure 7:
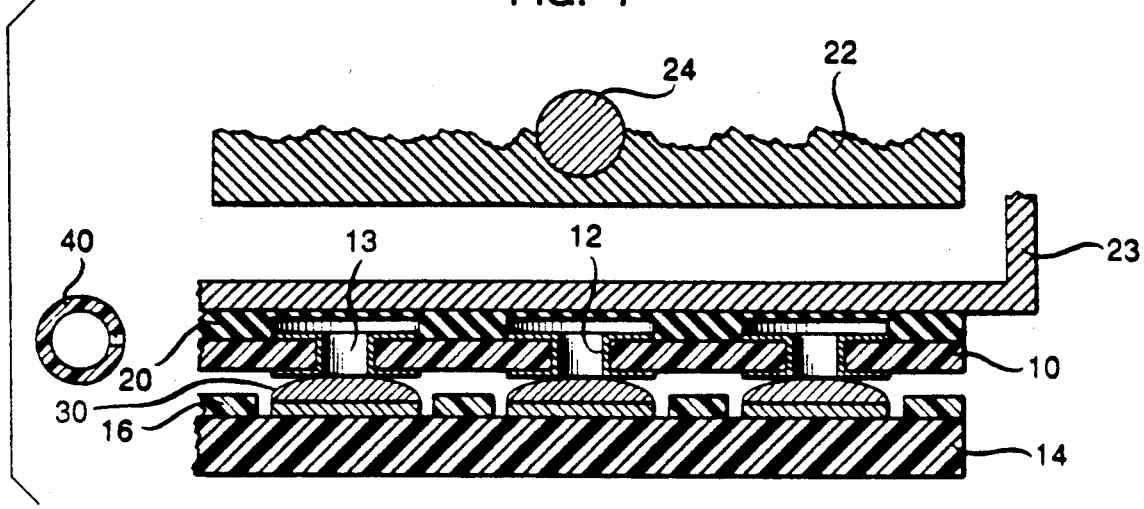
FIGS. 7-9 are cross-sectional schematic views of further stages of fabrication in accordance with the same embodiment.
Figure 8:
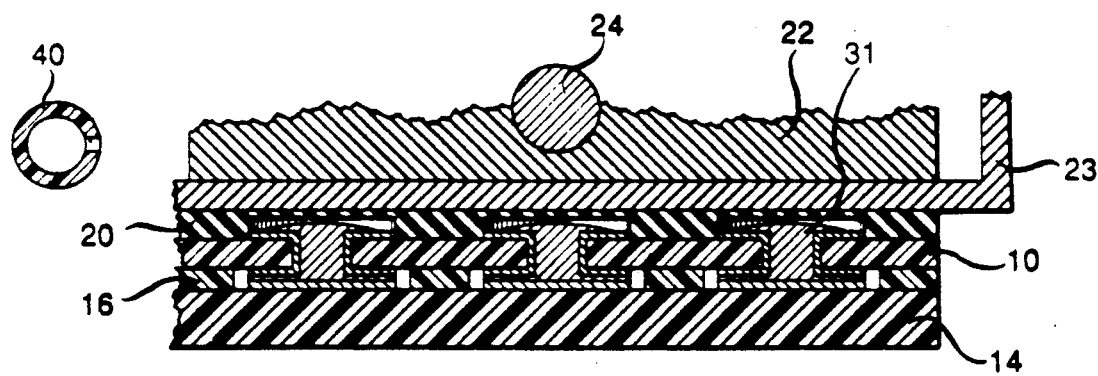

The printed circuit board, 14, is now ready to receive the flexible circuit, 10, for soldering thereto. The flexible circuit is usually prepared by applying flux to all of the holes, 13, and then drying to remove the volatiles in the flux. FIG. 6 illustrates the placement of the flexible circuit, 10, in the apparatus of FIG. 2 for soldering to the printed circuit board, 14. The flexible circuit is aligned with the board, again, by the use of standard tooling pins (not shown), so that the holes, such as 13, are positioned above and aligned with corresponding pads, such as 15, on the board. A shuttle element, 20, can be used for this portion of the operation as a cover plate, with the cavities, 21, empty and aligned with their corresponding holes, 13, and pads, 15. Use of relief in the cover plate allows the solder to flow up through the holes and out onto the exterior pad, 12, to form a rounded fillet with a free surface so as to permit the quality of the fillet to be inspected. As before, the hold-down, 23, contacts the shuttle to hold it (and the flexible circuit) in place while also preheating the solder surface (FIG. 7). Note at this point the plated through holes, 13, just make contact with the solder deposits such as 30. The hot ram, 22, is then pushed against the hold-down, 23, to heat the shuttle/flexible circuit/printed circuit board assembly. This causes the previously-deposited solder to melt and flow up through the plated-through holes, 13, and cover the pads, 12, forming fillet, 31, as well as closing the gap between the circuit, 10, and the layer, 16, on the circuit board, 14 (FIG. 8). The hot ram is then removed leaving the hold-down in position to hold the shuttle and flexible circuit in place while the solder cools. Air is blown over the surface of the hold-down to cool and solidify the solder joints as shown in FIG. 9. The cover plate (shuttle) is then removed leaving a completed assembly.

One of the solder joints formed in accordance with the invention is illustrated in the cross-sectional view of FIG. 10. This figure shows in more detail the portion of the flexible circuit 10, including its cover layers, 17 and 18, and ground plane, 50, bonded to a pad, 15, on the printed circuit board. As a result of choosing the appropriate amount of solder for each pad, the solder joint extends through the hole, 13, to the surface of the flexible circuit opposite to the surface which faces the printed circuit. The penetration of the solder through the hole is sufficient to form a fillet, 31, on the conductive portion, 12, on the opposite surface. Consequently, a simple visual inspection from above the assembly will verify which, if any, solder joints are defective and need repair. It will also be realized that the cover layers, 17 and 18, and solder mask, 16, also serve as solder dams to prevent solder from bridging to adjacent pads.

In order to carry out the solder assembly process with high yields and consistently produce reliable solder joints, it is preferable to observe several important design constraints. These "design-for-manufacturability" guidelines can be stated in terms of a set of dimensional relationships which should be observed in the design of certain elements of the circuits which are to be joined. For example, it is beneficial for the diameter of the hole in the flex circuit to be as small as is economically manufacturable and for the size (diameter) of the wettable pad areas on the flex circuit and the rigid circuit board to be a minimum of 2 times larger than the diameter of the hole in the flex circuit. Further, it is beneficial for the nominal separation of the associated pad areas on the flex circuit and printed wiring board after joint formation to be quite small (on the order of one tenth or less of the diameter of the pads). These objectives together assure that the volume of solder selected to form the joint can meet the conditions that the solder fillet initially formed on the pad of the rigid printed board completely spans that pad and forms a wetting angle which is indicative of the wettability of the printed circuit board pad, and that the solder fillet initially formed on the printed circuit pad has sufficient projection above any surrounding soldermask on the printed circuit board to facilitate good thermal contact and wetting to the associated pad and hole of the flex circuit to which it is to be solder assembled during the solder reflow operation. These dimensional relationships also ensure that there is sufficient solder volume in the final joint to completely occupy the total of the volume of space between the associated pads which are joined, the volume of the hole in the flex, and the volume of fillet spanning the exterior pad area so that the fillet forms a wetting angle to this exterior pad which is indicative of the wetting of the exterior pad and the quality of the joint. It is further beneficial that the aperture (opening) in the solder mask material and the cover layer material surrounding the interior flex circuit pad and the printed circuit board pad be sufficiently large compared to the size of pads they surround (typically 50% or more larger) to leave a free volume which is sufficiently large to accommodate any residual flux materials which are left upon completion of the assembly process.

It will be appreciated that the inventive method can be applied simultaneously to two sides of the printed circuit board by also providing a shuttle, hold-down and hot ram on the underside of the board. The solder underneath the board will wet the pads as a result of the surface tension which causes the coalesced solder from the paste to tend to form a sphere which protrudes from the shuttle cavities when the solder is melted. Further, while the invention is most advantageous for bonding flexible circuits to printed circuit boards as described, it may be applied wherever it is desired to solder two components, especially when one component is flexible and the other is rigid. It will also be appreciated that the shuttle elements can be supplied on reels so that successive elements can be aligned with respective boards in an automated fashion.

Various additional modifications will become apparent to those skilled in the art. All such variations which basically rely on the teachings through which the invention has advanced the art are properly considered within the scope of the invention.

What is claimed is:

1. A device comprising:
   first and second components with pad areas on facing surfaces which are soldered together, at least one of said components including metalized holes in the pad areas which are soldered and the pad areas of the other of said components being essentially flat and not extending into said holes; and
   solder fillets formed between pad areas on said facing surfaces and extending through said holes to associated pad areas on the surface of said one component opposite to the facing surface of said one component so that the fillets on said associated pad areas can be inspected.

2. The device according to claim 1 wherein the components are a flexible circuit and a printed circuit board.

3. The device according to claim 2 wherein the metalization of the holes extends from the pad areas of the facing surface to the associated pad areas of the opposite surface of said one component.

4. The device according to claim 2 wherein the printed circuit board includes a mask material surrounding the pad areas on a facing surface, and the flexible circuit includes a cover layer surrounding the holes formed in the pad areas on a facing surface, the mask material and cover layer leaving exposed areas of the two components which are wettable by solder.

5. The device according to claim 1 wherein the pad areas and holes are essentially circular, the diameter of the pad areas of the said one component are at least two times larger than the diameter of the holes, and the separation of the pad areas on the facing surfaces is no more than one-tenth of the diameter of the pad areas of the other of said components.

* * * * *

UNITED STATES PATENT AND TRADEMARK OFFICE
CERTIFICATE OF CORRECTION

PATENT NO. : 5,014,162

DATED : May 7, 1991

INVENTOR(S) : William A. Clark, Michael A. Oien and Walter Pelosi

It is certified that error appears in the above-identified patent and that said Letters Patent is hereby corrected as shown below:

In the Abstract, line 1, "apparatus involving" should read --apparatus, method, and resulting product involving--;

Column 6, line 49, "claim 2" should read --claim 1--.

Signed and Sealed this

Twenty-second Day of June, 1993

Attest:

MICHAEL K. KIRK

*Attesting Officer*     Acting Commissioner of Patents and Trademarks